(12) United States Patent
Lin et al.

(10) Patent No.: US 9,439,292 B1
(45) Date of Patent: Sep. 6, 2016

(54) METHOD FOR MANUFACTURING A CIRCUIT BOARD WITH BURIED ELEMENT HAVING HIGH DENSITY PIN COUNT AND THE CIRCUIT BOARD STRUCTURE

(71) Applicant: KINSUS INTERCONNECT TECHNOLOGY CORP., Taoyuan (TW)

(72) Inventors: Ting-Hao Lin, Taipei (TW); Yi-Fan Kao, New Taipei (TW); Jaen-Don Lan, New Taipei (TW); Yung-Lin Chia, Taoyuan County (TW); An-Ping Tseng, Taipei (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 63 days.

(21) Appl. No.: 14/641,016

(22) Filed: Mar. 6, 2015

(51) Int. Cl.
*H05K 1/18* (2006.01)
*H05K 3/06* (2006.01)
*H05K 3/00* (2006.01)

(52) U.S. Cl.
CPC ............. *H05K 3/064* (2013.01); *H05K 1/185* (2013.01); *H05K 3/0008* (2013.01)

(58) Field of Classification Search
CPC ............... H01L 21/4857; H01L 2924/01078; H01L 2924/014; H05K 1/09; H05K 1/111; H05K 1/115; H05K 2201/09509; H05K 2201/09536; H05K 3/0026; H05K 3/007; H05K 3/022; H05K 3/064; H05K 3/188; H05K 3/4038
See application file for complete search history.

(56) References Cited

U.S. PATENT DOCUMENTS 6,410,858 B1 * 6/2002 Sasaki ............... H01L 23/49822
174/200
2016/0174387 A1 * 6/2016 Tuominen ............ H05K 1/0298
361/760

* cited by examiner

*Primary Examiner* — Jeremy C Norris
*Assistant Examiner* — Roseline Alicea Rivera
(74) *Attorney, Agent, or Firm* — Lin & Associates Intellectual Property, Inc.

(57) ABSTRACT

A method for manufacturing a circuit board with a buried element having high density pin count, wherein a micro copper window formed in a first circuit by patterned dry film electroplating is easily controlled less than 50 μm so that the micro conduction holes formed after the laser drilling each has a diameter greatly shrunk less than 50 μm so as to highly increase density of the micro conduction holes, thereby facilitating in burial of the buried element with the high density pin count. Additionally, by disposing the micro conduction holes in the same elevation, optically aligning a fixing position for the buried element can be controlled precisely.

10 Claims, 6 Drawing Sheets

METHOD FOR MANUFACTURING A CIRCUIT BOARD WITH BURIED ELEMENT HAVING HIGH DENSITY PIN COUNT AND THE CIRCUIT BOARD STRUCTURE

BACKGROUND OF THE INVENTION

1. Field of the Invention

The present invention relates generally to a method for manufacturing a circuit board with a buried element, and more specifically to a method for manufacturing a circuit board having a buried element including high density pin count and the circuit board structure having the buried element.

The so-called "embedded passives" generally indicate passive elements which are buried within multiple layers constituting a circuit board during the fabrication process. During the fabrication process of a circuit board, etching or screen printing techniques are implemented in order to directly form the passive elements, such as capacitor or resistor, on the inner layers which are later passed through the pressing and lamination processes to discrete the passive elements within the circuit board, thereby eliminating the soldering technique and effectively increase the mounting surface area for layout of circuits and the buried active and passive elements.

2. The Prior Arts

In the presently available circuit board with the buried passive elements, active elements can be also buried therein by implementing the above similar technique so as to increase the entire density of the elements. Since the functions of mobile phones of other electronic devices of present days become larger as days gone by, the I/O pin count of chips inherently should also be increased such that fabrication of a carrier plate requires reduced spacing among the I/O pins in order to form the high density pins. Since the I/O pin count of the chips used microvias to establish electrical communication among the circuit structure in the circuit board, it is highly desired to reduce the size of microvias and the spacing among the microvias so as to accommodate more buried elements in the circuit board.

Figure 1:
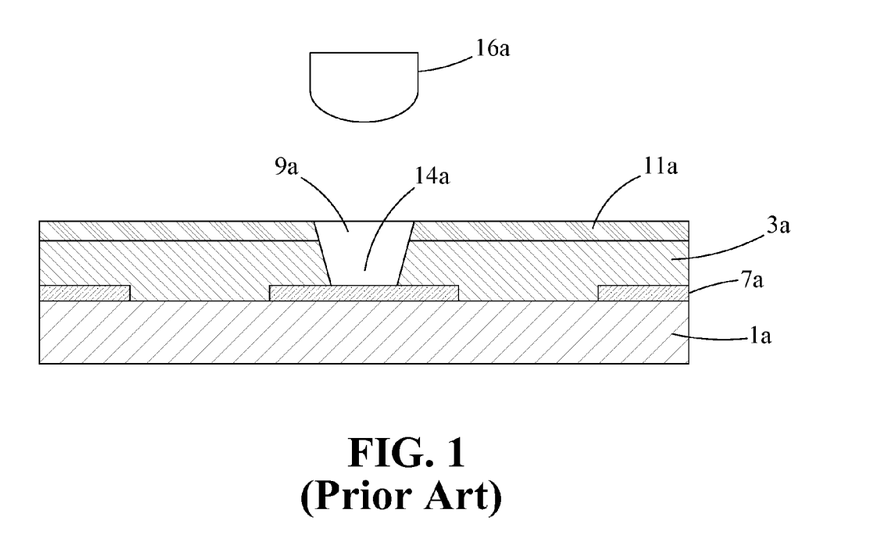
FIG. 1 shows how a copper window is formed within an interlayer connection structure in the prior arts.

The presently existing microvia is primarily manufactured by the laser drilling process such as conformal mask drilling, enlarge window drilling and copper direct drilling. FIG. 1 shows how a copper window is formed according to the prior art method. As illustrated, a first circuit 7a is formed on a first stack plate 1a. Next, the insulation layer 3a is formed on the first stack plate 1a and the first circuit 7a, and the second circuit 11a is formed on the insulation layer 3a. Then, part of the second circuit 11a is etched to form the opening (copper window 9a), and the opening is processed by the laser 16a to form the conduction hole 14a on the insulation layer 3a.

However, the diameter of the conduction hole manufactured by the process of copper window is limited by the size of the laser beam passing through the mask, particularly the processes of photoresist development and photolithography. As a result, the size of the window for the conduction hole can not be further reduced and the circuit density of the circuit board is hard to increase, thereby hindering the conduction hole to establish electrical communication with the high density pin count of the active element.

Specifically, since it is difficult for a copper foil (the second circuit 11a) to absorb the laser wavelength, the process of photoresist development needs the help of the photolithography to form the opening in the second circuit 11a. Based on the current technology, the window formed on the patterned photoresist layer has a minimum size larger than 50 μm. Thus, the opening formed by etching the second circuit 11a is surely larger than 50 μm.

In addition, the process of desmear performed after laser drilling greatly widens the opening size such that the circuit spacing in the final product is only 140 μm.

In addition, the currently technique of mechanical drilling is done to form a through hole with a diameter 0.5~3 mm for serving as a target point, the alignment tolerance and the International transfer tolerance is roughly 15 μm. Thus, the tolerance error on the drilled object is generally greater than 30 μm, which, in turn, limits the etching process done onto the circuits (or copper pads) and causes no width reduction in the circuits and no spacing reduction among the circuits (failing to provide more high density pin). If the copper window is further widened in the copper window process, the usage of the available circuit area of the second circuit 11a is reduced. While the process of direct laser may omit the process of forming the copper window, the absorption of the laser beam needs to increase and the size of the opening is still limited by the beam size through the mask.

Therefore, one drawback of the prior art method is that the opening size formed through the copper window process has a diameter greater than 50 μm, the circuit path spans more greater than 150 μm, the spacing between adjacent pair of the circuits is greater than 30 μm, which in turn, only accommodate chips with lesser pin counts. Owing to the preceding restrictions, the alignment tolerance and the International transfer tolerance, the size of microvia cannot be miniaturized so is the spacing among the circuits. Since the prior art method and structure is not suitable for burying the active element with high density pin count, a method for manufacturing a circuit board with buried element having high density pin count is urgently needed to overcome the above problems in the prior arts.

SUMMARY OF THE INVENTION

The primary objective of the present invention is to provide a method for manufacturing a circuit board a circuit board having a buried element including high density pin count. The method for manufacturing the circuit board includes the steps: electroplating a carrier plate such that a first metal layer is formed on the carrier plate; forming a first circuit on one side surface of the first metal layer, wherein the first circuit includes a plurality of copper pads; covering a photoresist layer over the first metal layer and the first circuit; patterning the photoresist layer such that only the first circuit is covered by the photoresist layer after the patterning process; etching the first metal layer covered by remaining portions of the photoresist layer, thereby removing the photoresist layer entirely; providing an adhesive layer between some of the copper pads and a buried element in order to fix the buried element over the adhesive layer, wherein the buried element has a plurality of high density I/O (Input/Output) pins, each is aligned with a micro copper window defined between an adjacent pair of the copper pads and is staggered with a copper window defined by one of the copper pads adjacent to the micro copper window, wherein establish the copper window as a target point; sequentially forming an insulating layer and a second metal layer over the first circuit and the buried element and removing the carrier plate and etching the first metal layer until the adhesive layer is exposed from the first metal layer via the micro copper window while the insulating layer is exposed from the first metal layer via the copper window; optically aligning the target point and employing a drilling process to drill through the insulation layer between corresponding pair of the I/O pin and the micro copper window so as to form a micro through hole in alignment with the I/O connection pin and a through hole extending through the insulating layer and the second metal layer and in alignment with the copper window; electroplating to form a conduction layer which covers the micro through hole and the through hole; and etching the conduction layer in order to remove portions of the first metal layer until exposing the first circuit and simultaneously forming a plurality of micro conduction holes and a plurality of conduction holes to establish electrical communication between the first circuit and the I/O connection pins of the buried element.

It is to note that after manufacturing of the circuit board, inner ends of the micro conduction holes are electrically connected with the high density I/O pins of the buried element while outer ends of the micro conduction holes are intended for connection with external circuits. In addition, the second metal layer is undergone a patterning process to form a second circuit which establishes electrically communication with the first circuit through the conduction holes in the conduction layer.

One primary feature of the present invention is that employing patterned dry film electroplating to form the first circuit and define the micro copper window for serving as target point and removing the carrier plate so as to form the first circuit and the micro copper window of buried type such that the adhesive layer is exposed from the micro copper window defined by adjacent pair of two copper pads. Since copper is hard to absorb the laser beam, when the laser beam is incident onto the two copper pads and the adhesive layer, only the adhesive layer allows the laser beam to penetrate so as to form the micro through hole. Thus, the micro through hole has the size as the micro copper window in the first circuit, and is not limited by the laser beam size through the mask.

In addition the first circuit of the present invention is a buried circuit and the micro through hole is not covered with the metal layer when the micro through hole is formed in the adhesive layer. Thus, the laser beam can directly penetrate the adhesive layer to form the micro through hole. However, the insulation layer is covered with the metal layer in the prior arts, and since the laser beam is hard to penetrate the metal layer, the copper window is first formed on the metal layer by means of image transfer, and the insulation layer is then drilled by laser to form the micro through hole. Particularly, after the laser drilling process, the process of desmear is needed to perform such that the micro through hole is widened. In general, the minimum spacing between adjacent circuits in the final product is only 140 µm.

The micro copper window formed in the first circuit by patterned dry film electroplating, the width or the spacing between adjacent pair of the first circuits is easily controlled less than 50 µm. In addition, during the manufacturing process to form the first circuit and the copper window, only the metal layer and the carrier plate, which are made of metal material, are treated, and the processing parameters are easy to adjust, thereby precisely controlling the circuit width and the spacing among adjacent pair of the first circuits.

Since the micro copper window formed in the first circuit by patterned dry film electroplating is easily controlled less than 50 µm, after the insulation layer between the first circuit and the second circuit is laser drilled, the micro conduction hole manufactured has a diameter greatly shrunk to less than 50 µm so as to increase circuit density and hence the high density pin count. It is noted that the circuit width and the spacing between adjacent pair of the circuits can be precisely and definitely controlled. In addition, employing the micro copper window as the target point and optically aligning laser beam toward the buried element also results in high precision in the drilling process and hence the diameter of micro conduction hole can be shrunk below 10 µm. Under this condition, as far as 20,000 high density pins can be buried in the circuit board manufactured according to the method of the present invention.

The other object of the present invention is to provide a circuit board structure with buried high density pin count manufactured according the above method includes an insulating layer; at least one first circuit buried within the insulating layer; a second circuit formed exterior of the insulating layer; an adhesive layer and a buried element respectively buried within the insulating layer such that the buried element is located above the adhesive layer, wherein the buried element has a plurality of high density Input/Output (I/O) pins disposed within the adhesive layer so as to define a plurality of micro conduction holes, portions of the first circuit located outside of the insulating layer cooperate the second circuit to define a plurality of conduction holes.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 2:
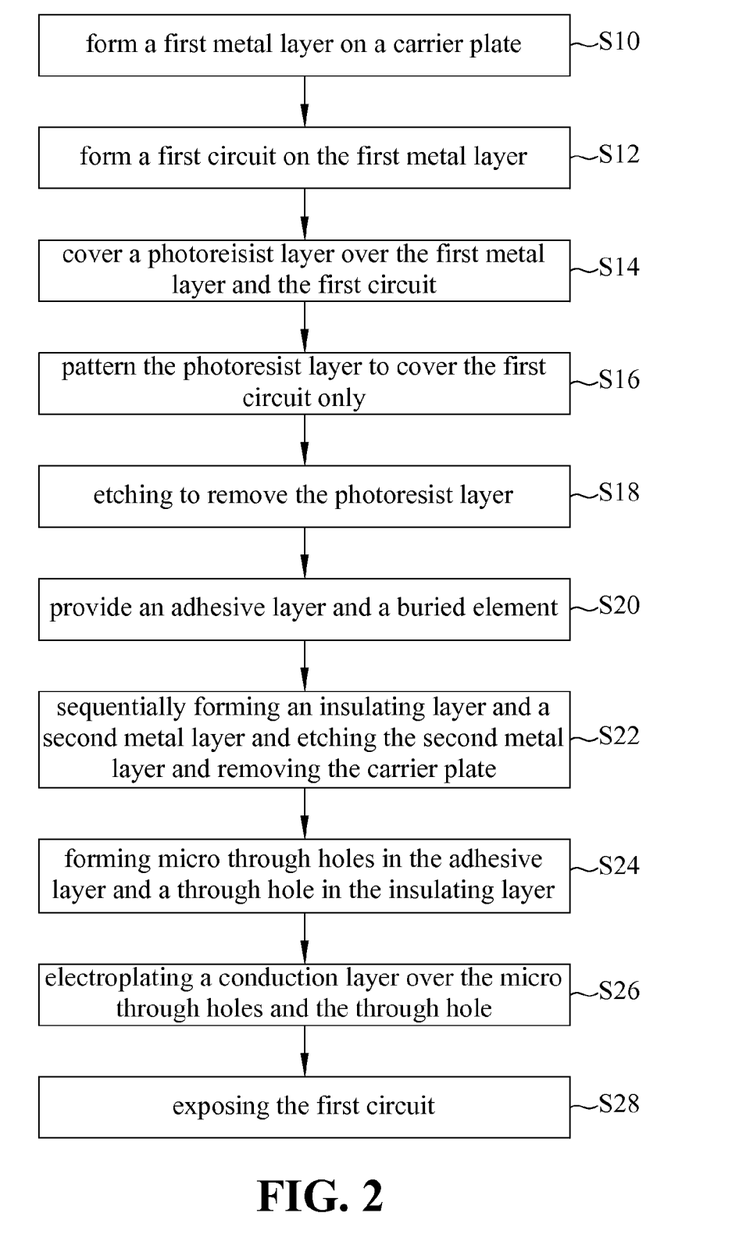
FIG. 2 is a flowchart showing the steps of the method for manufacturing a circuit board having a buried element according to the present invention.
Figure 3A:
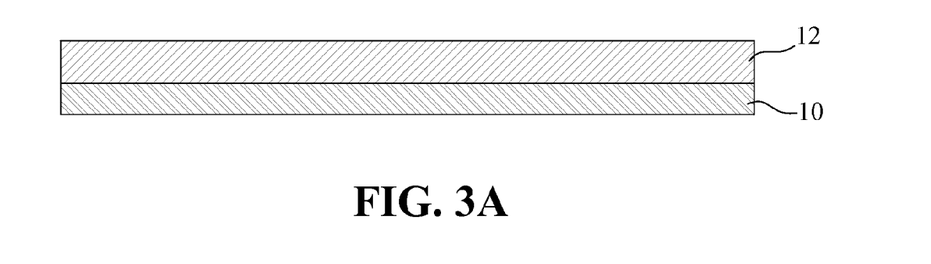
FIGS. 3A-3J are sectional views showing the sequential steps of the method for manufacturing the circuit board having the buried element with high density pin count according to the present invention.

FIG. 2 is a flowchart showing the steps of the method for manufacturing a circuit board having a buried element according to the present invention. FIGS. 3A-3J illustrates sectional views of the sequential processing steps for the method of the present invention. As shown in FIG. 2, the method for manufacturing the circuit board having a buried element generally includes the processing steps S10, S12, S14, S16, S18, S20, S22, S24 and S26. First, the step S10 is performed by providing a carrier plate 10 (FIG. 3A), and a metal layer 12 is electroplated on the carrier plate 10 in step S12 (FIG. 3A). The metal layer 12 is preferably formed of copper (Cu) or other suitable metal material.

Figure 3B:
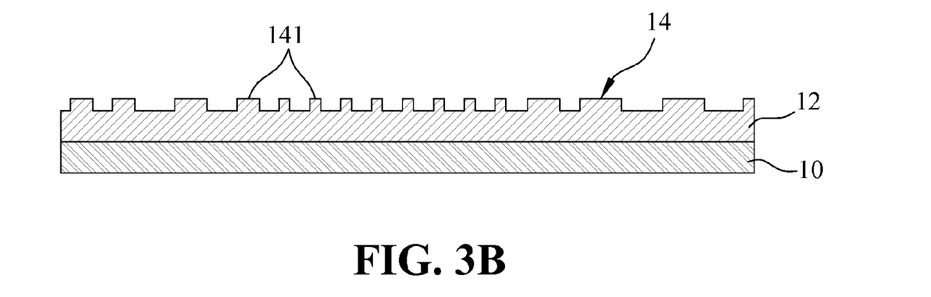

In the step S12, one side surface of the metal layer 12 is patterned to form the first circuit 14, which includes a plurality of copper pads 141 (FIG. 3B). It is preferred that the first circuit 14 is formed by the process of patterned dry film electroplating or other suitable scheme.

Figure 3C:
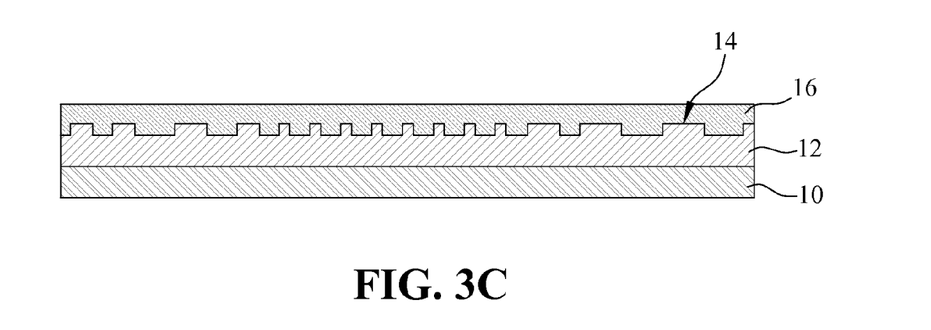

The step S14 is performed by covering the first circuit 14 and the first metal layer 12 with a photoresist layer 16 (FIG. 3C).

Figure 3D:
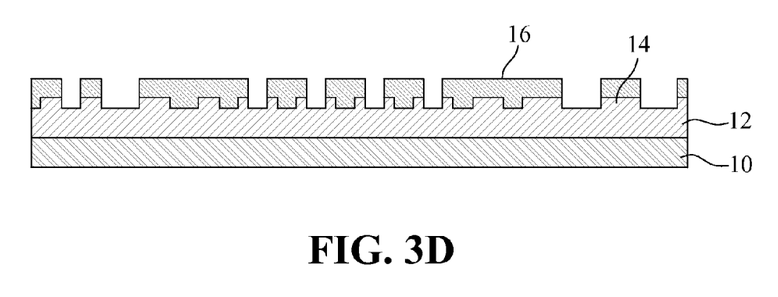

In the step S16, the photoresist layer 16 is patterned in such a manner that after the patterning process. Only the first circuit 14 is covered by the photoresist layer 16 as best shown in FIG. 3D. The photoresist layer 16 is formed of a dry film photoresist or a wet film photoresist.

Figure 3E:
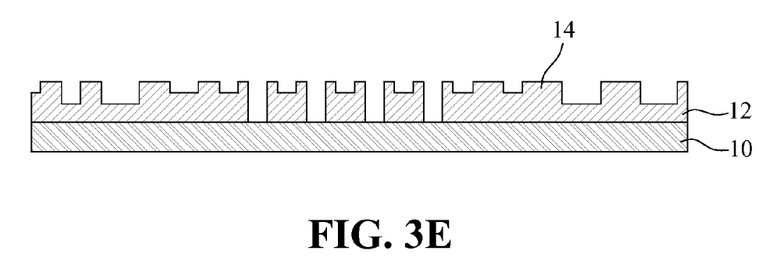

In the step S18, the portions of the first circuit 14 uncovered by the photoresist layer 16 are etched to a predetermined depth in the first metal layer 12 until the photoresist layer 16 is removed entirely therefrom (see FIG. 3E). Note some specific position of the first metal layer 12 is etched relatively deep while the remaining position remains shallow.

The etching process conducted on the first metal 12 in the step S18 depends on the requirement of the finished product and is illustrated for better understanding of the present invention and therefore should not be limited only thereto.

Figure 3F:
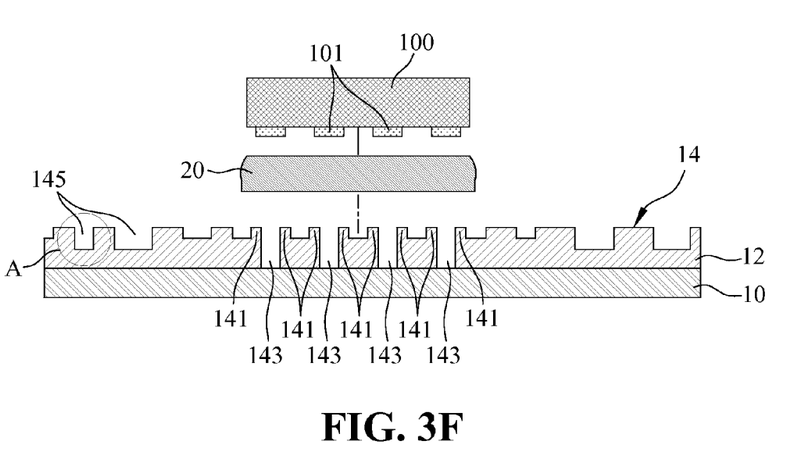

In the step S20, an adhesive layer 20 is provided over some of the copper pads 141 located within and the specific position of the first metal layer 12 in order to fix a buried element 100 over the adhesive layer 20, wherein the buried element 100 has a plurality of high density I/O (Input/Output) pins 101, each is aligned with a micro copper window 143 defined between an adjacent pair of the copper pads 141 and is staggered with a copper window 145 defined by one of the copper pads 141 adjacent to the micro copper window 143, wherein mounting of the buried element 100 is conducted by establish the copper window 145 as a target point A, as best shown in FIG. 3F, so as to result in minimizing the least tolerance error.

The buried element 100 is selected from a group consisting of active elements, passive elements or other suitable electronic gadgets. Preferably, the adhesive layer 20 is formed by epoxy dispensing, screen printing techniques or lamination process.

Figure 3G:
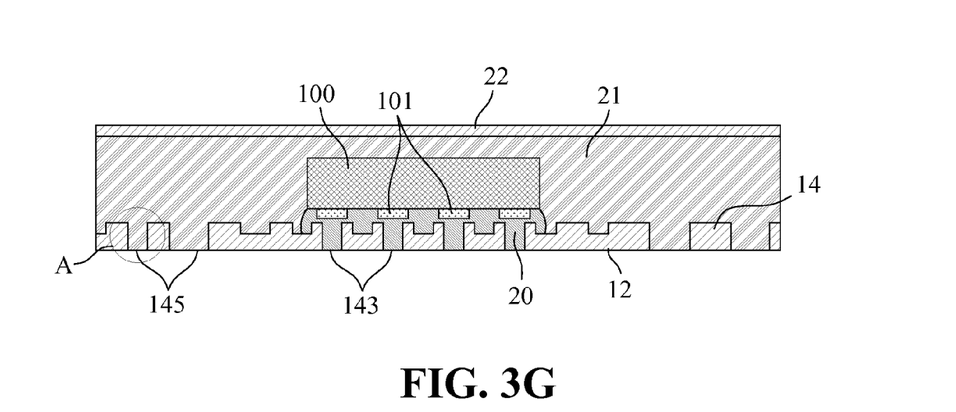

In the step S22, an insulating layer 21 and a second metal layer 22 are formed sequentially to over the first circuit 14 and the buried element 100 while the carrier plate 10 is removed and simultaneously conduct the etching process on the first metal layer 12 until the adhesive layer 20 is exposed from the first metal layer 12 via the micro copper window 143 while the insulating layer 21 is exposed from the first metal layer 12 via the copper window 145, as shown in FIG. 3G.

Figure 3H:
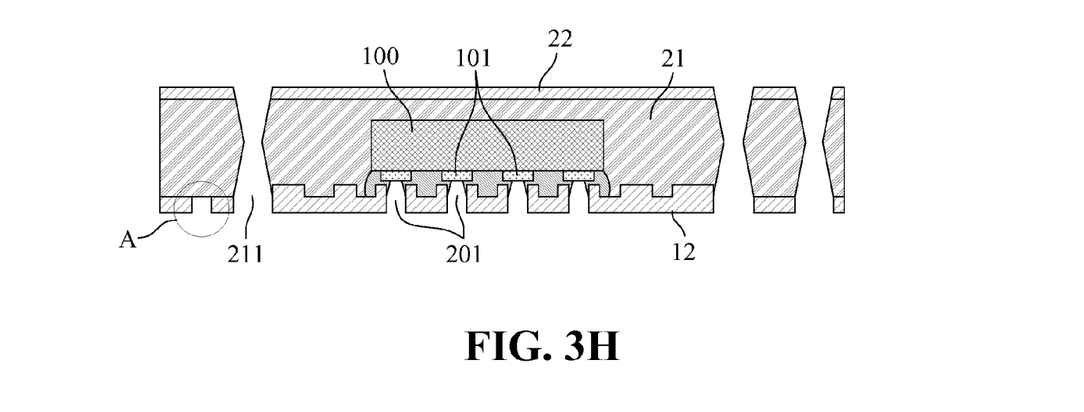

In the step S24, optically align the target point A and employ a drilling process to drill through the insulation layer 21 between corresponding pair of the I/O pin 101 and the micro copper window 143 so as to form a micro through hole 201 in the adhesive layer 20 such that the micro through hole 201 is in alignment with a respective one of the I/O connection pins 101 and a through hole 211 that extends through the insulating layer 21 and the second metal layer 22 and that is in alignment with the copper window 145, as shown in FIG. 3H.

Note that the above drilling process is a laser drilling process, which employs a mask to define a size of a laser beam, and the size or diameter of the micro through hole 201 is specified by the size of the copper window 143.

Figure 3I:
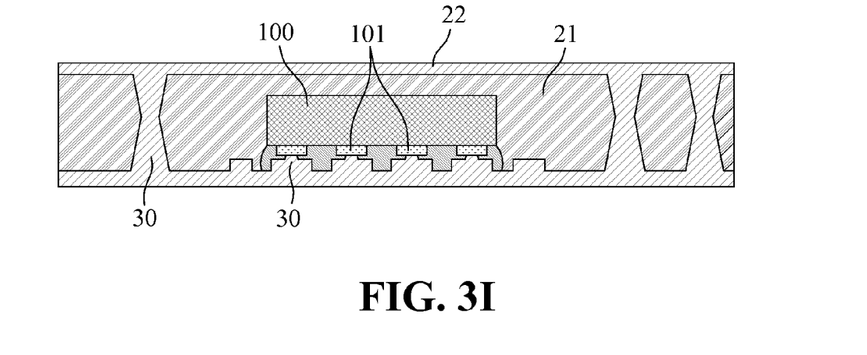

In the step S26, a conductive layer 26 is electroplated so as to cover the micro through hole 201 and the through hole 211 (FIG. 3I). Specifically, the conductive layer 26 is formed of a metal layer.

In the step S28, the etching process is performed on the conduction layer 30 in order to remove portions of the first metal layer 12 until exposing the first circuit 14 and simultaneously forming a plurality of micro conduction holes 301 and a plurality of conduction holes 303 to establish electrical communication between the high density I/O pins 101 of the buried element and the micro conduction holes 301 and the conduction holes 303. Each micro conduction holes 301 is a blind via hole or a buried via hole. The outer ends of the micro conduction holes 301 are intended for electrical connection with the external circuit (not visible). In addition, the second metal plate 22 is patterned in such a manner that after the patterning process a second circuit 221 is formed and is connected electrically with the first circuit 14 via the conduction hole 303, as shown in FIG. 3J.

Figure 3J:
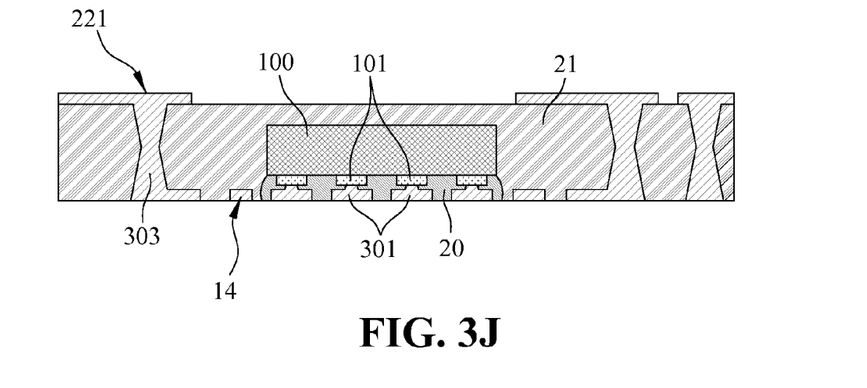

Referring to FIG. 3J, a circuit board structure with buried high density pin count manufactured according the above method includes an insulating layer 21; at least one first circuit 14 buried within the insulating layer 21; a second circuit 221 formed exterior of the insulating layer 21; an adhesive layer 20 and a buried element 100 respectively buried within the insulating layer 21 such that the buried element 100 is located above the adhesive layer 20, wherein the buried element 100 has a plurality of high density Input/Output (I/O) pins 101 disposed within the adhesive layer 20 so as to define a plurality of micro conduction holes 301 in electrical connection relative to one another, portions of the first circuit 14 located outside of the insulating layer 21 cooperate the second circuit 221 to define a plurality of conduction holes 303.

Figure 4:
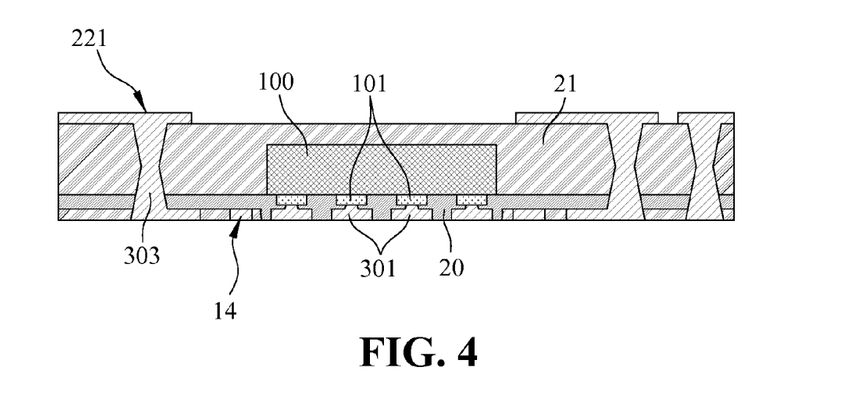
FIG. 4 is a cross-sectional view of the circuit board of the present invention having the buried element with high density pin count.

FIG. 4 shows a preferred embodiment of the circuit board structure with buried element of the present invention. More specifically, the adhesive layer 20 is laminated entirely throughout the length of the first circuit 14 so as to facilitate the manufacturing process, which means, in the step S20, the adhesive layer 20 is in sheet or roll form which entire surface is directly laminated on the first circuit 14 such that portion of the adhesive layer 20 has an opening aligned with the copper window 145 defines the through hole 211 after the drilling performance. The following steps are the same as described in the preceding paragraphs.

From the above mention, one primary feature of the present invention is that the steps S10~S20 are employed to form the first circuit 14 and define the micro copper window by means of patterned dry film electroplating, and the step S22 is to form buried circuit in the first circuit 14 and the copper window after removal of the carrier plate 10 such that the adhesive layer 20 is exposed from the micro copper window 143 defined by adjacent pair of two copper pads 141. Since copper is hard to absorb the laser beam, when the laser beam is incident onto the two copper pads 141 and the adhesive layer 20, only the adhesive layer 20 allows the laser beam to penetrate so as to form the micro through hole 201. Thus, the micro through hole 201 has the size as the micro copper window 143 in the first circuit 14, and is not limited by the laser beam size through the mask.

Furthermore, the first circuit 14 of the present invention is a buried circuit and the micro through hole 201 is not covered with the metal layer when the micro through-hole is formed in the adhesive layer 20. Thus, the laser beam can directly penetrate the adhesive layer 20 to form the micro through hole 201. However, the insulation layer is covered with the metal layer in the prior arts, and since the laser beam is hard to penetrate the metal layer, the copper window is first formed on the metal layer by means of image transfer, and the insulation layer is then drilled by laser to form the micro through hole. Particularly, after the laser drilling process, the process of desmear is needed to perform such that the micro through hole is widened. In general, the minimum spacing between adjacent circuits in the final product is only 140 μm.

In contrast, in the present invention, the metal layer is treated by the process of patterned dry film electroplating to form the first circuit 14 and the micro copper window 143. For the current manufacturing technology, the line width and the spacing of the first circuit 14 can be easily controlled less than 50 μm. Additionally, during the formation of the first circuit and the copper window, only the metal layer and the carrier plate, which are made of metal material, are treated, and the processing parameters are easy to adjust, thereby precisely controlling the line width and the spacing among adjacent pair of the first circuits.

Since the micro copper window formed in the first circuit by patterned dry film electroplating is easily controlled less than 50 μm, after the insulation layer 21 between the first circuit 14 and the second circuit 221 is laser drilled, the micro conduction hole 301 manufactured has a diameter greatly shrunk to less than 50 μm so as to increase circuit density and hence the high density pin count, which in turn, facilitate the burial of the buried element having high density pin count. Additionally, by disposing the micro conduction holes in the same elevation, optically aligning for fixing position the buried element can be controlled precisely. It is noted that as far as 20,000 high density pins can be buried in the circuit board manufactured according to the method of the present invention.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for manufacturing a circuit board with buried high density pins, comprising:
    electroplating a carrier plate such that a first metal layer is formed on said carrier plate;
    forming a first circuit on one side surface of said first metal layer, wherein said first circuit includes a plurality of copper pads;
    covering a photoresist layer over said first metal layer and said first circuit;
    patterning said photoresist layer such that only said first circuit is covered by said photoresist layer after the patterning process;
    etching said first metal layer covered by remaining portions of said photoresist layer, thereby removing said photoresist layer entirely;
    providing an adhesive layer between some of said copper pads and a buried element in order to fix said buried element over said adhesive layer, wherein said buried element has a plurality of high density I/O (Input/Output) pins, each is aligned with a micro copper window defined between an adjacent pair of said copper pads and is staggered with a copper window defined by one of said copper pads adjacent to said micro copper window, wherein establish said copper window as a target point;
    sequentially forming an insulating layer and a second metal layer over said first circuit and said buried element and removing said carrier plate and etching said first metal layer until said adhesive layer is exposed from said first metal layer via said micro copper window while said insulating layer is exposed from said first metal layer via said copper window;
    optically aligning said target point and employing a drilling process to drill through the insulation layer between corresponding pair of said I/O pin and said micro copper window so as to form a micro through hole in alignment with said I/O pin and a through hole extending through said insulating layer and said second metal layer and in alignment with said copper window;
    electroplating to form a conduction layer which covers said micro through hole and said through hole; and
    etching said conduction layer in order to remove portions of said first metal layer until exposing said first circuit and simultaneously forming a plurality of micro conduction holes and a plurality of conduction holes for establishing electrical communication between said I/O pins of said buried element with said micro conduction holes and said conduction holes.

2. The method as claimed in claim 1, wherein said carrier plate is fabricated from metal material.

3. The method as claimed in claim 1, wherein said first circuit is formed by a process of patterned dry film electroplating.

4. The method as claimed in claim 1, wherein said photoresist layer is in form of a dry film photoresist or a wet film photoresist.

5. The method as claimed in claim 1, wherein mounting of said buried element is conducted based on said target point.

6. The method as claimed in claim 1, wherein said buried element is in form of an active element or a passive element.

7. The method as claimed in claim 1, wherein said adhesive layer is fabricated via epoxy dispensing technique, screen printing or sequentially lamination process in form a sheet or roll and is laminated on said first circuit, wherein said adhesive layer has an opening aligned with said copper window being filled by said conduction hole.

8. The method as claimed in claim 1, wherein said drilling process is a laser drilling process.

9. The method as claimed in claim 1, wherein each of said micro conduction holes is a blind via hole or a buried via hole.

10. A circuit board structure with buried high density pin, comprising:
    an insulating layer;
    at least one first circuit buried within said insulating layer;
    a second circuit formed exterior of said insulating layer;
    an adhesive layer and a buried element respectively buried within said insulating layer such that said buried element is located above said adhesive layer, wherein said buried element has a plurality of high density Input/Output (I/O) pins disposed within said adhesive layer so as to define a plurality of micro conduction holes, portions of said first circuit located outside of said insulating layer cooperating with said second circuit to define a plurality of a plurality of conduction holes.

* * * * *